United States Patent
Doering et al.

(10) Patent No.: US 12,057,333 B2
(45) Date of Patent: Aug. 6, 2024

(54) METROLOGY SLOT PLATES

(71) Applicant: Applied Materials, Inc., Santa Clara, CA (US)

(72) Inventors: Kenneth Brian Doering, San Jose, CA (US); Vivek B. Shah, Santa Clara, CA (US); Ashutosh Agarwal, San Jose, CA (US); Sanjeev Baluja, Campbell, CA (US); Shrihari Sampathkumar, Mountain View, CA (US); Chunlei Zhang, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 314 days.

(21) Appl. No.: 17/466,403

(22) Filed: Sep. 3, 2021

(65) Prior Publication Data

US 2023/0076170 A1 Mar. 9, 2023

(51) Int. Cl.
*H01L 21/67* (2006.01)
*H01L 21/66* (2006.01)

(52) U.S. Cl.
CPC ........ *H01L 21/67248* (2013.01); *H01L 22/12* (2013.01); *H01L 22/30* (2013.01); *H01L 21/67103* (2013.01)

(58) Field of Classification Search
None
See application file for complete search history.

(56) References Cited

U.S. PATENT DOCUMENTS

| | | | |
|---|---|---|---|
| 5,226,731 A * | 7/1993 | Allen | G01J 5/041 374/128 |
| 7,691,204 B2 | 4/2010 | Chacin et al. | |
| 9,734,568 B2 | 8/2017 | Vajaria et al. | |
| 9,811,006 B2 | 11/2017 | Wildenberg et al. | |
| 9,818,658 B2 | 11/2017 | Wilby et al. | |
| 9,884,726 B2 | 2/2018 | Van Der Meulen et al. | |
| 9,911,634 B2 | 3/2018 | Bello et al. | |
| 2010/0024887 A1* | 2/2010 | Williams | F15D 1/00 454/189 |
| 2013/0112680 A1 | 5/2013 | Moritz et al. | |
| 2017/0370001 A1 | 12/2017 | Yudovsky | |
| 2020/0335369 A1 | 10/2020 | Krishnamurthy et al. | |
| 2020/0392621 A1 | 12/2020 | Aubuchon et al. | |
| 2021/0175101 A1* | 6/2021 | Hu | G01J 5/0818 |

FOREIGN PATENT DOCUMENTS

JP 2004119995 A 4/2004

OTHER PUBLICATIONS

PCT International Search Report and Written Opinion in PCT/US2022/042442 dated Dec. 29, 2022, 11 pages.

* cited by examiner

*Primary Examiner* — Charles Capozzi
(74) *Attorney, Agent, or Firm* — Servilla Whitney LLC (57) ABSTRACT

Metrology slot plates, processing chamber lids and processing chambers having metrology slot plates are described. Each of the metrology slot plates independently comprises one or more of a plate blank, a reflectometer, a capacitance sensor, a gas flow meter, a manometer, a pyrometer, a distance sensor (laser) or an emissometer.

3 Claims, 9 Drawing Sheets

METROLOGY SLOT PLATES

TECHNICAL FIELD

Embodiments of the disclosure generally relate to processing chamber lids. More particularly, embodiments of the disclosure are directed to processing chamber lids incorporating metrology slot plates.

BACKGROUND

In microelectronics device fabrication there is a need to optimize in-situ wafer processing. In some processing chambers, including atomic layer deposition (ALD) chambers, wafers and heaters are rapidly moved between processing stations allow for separate precursor and reactive chemistry exposures. It is often difficult to precisely measure the temperature and film properties of wafers in a contact-free environment, as the wafers move without experiencing thermal perturbation and process contamination.

Additionally, wafer placement on substrate supports or heaters, also referred to as wafer hand-off, can affect the integrity and uniformity of films formed on the wafer. The thickness of metal oxide ALD films, for example, are particularly sensitive to wafer hand-off. Typically, wafer hand-off is performed visually, however, this method is often inaccurate and time-consuming. Manual wafer hand-off also requires lifting the processing chamber lid, which breaks vacuum and may disrupt the wafer processing.

Accordingly, there is a need to control, calibrate, evaluate, and monitor in-situ wafer processing in real-time without measurement drift and breaking vacuum.

SUMMARY

One or more embodiments of the disclosure are directed to a metrology slot plate. The metrology slot plate comprises an elongate metrology plate body having a top surface and a bottom surface defining a thickness of the body, an inner end and an outer end defining a length of the body. The elongate metrology plate body has an upper portion and a lower portion. The upper portion has a greater width than the lower portion to form a bottom face of the upper portion. The lower portion has a first side face and a second side face extending along a length of the lower portion. The metrology slot plate comprises an inlet in the top surface of the elongate metrology plate body. The inlet is connected to a gas channel extending at least partially through the thickness of the body to an outlet. The metrology slot plate comprises a pyrometer opening extending through the thickness of the body.

Another embodiment of the disclosure is directed to a processing chamber lid. The processing chamber lid comprises a lid body having a top surface and a bottom surface defining a thickness of the lid body. The lid body has a reference axis extending along a direction perpendicular to the lid body. The processing chamber lid comprises a plurality of station openings extending through the thickness of the lid body and arranged symmetrically around the reference axis of the lid body. The processing chamber lid comprises a plurality of slotted openings extending through the thickness of the lid body, each of the slotted openings positioned between adjacent station openings and having a length and a width, the length measured from an inner end of the slotted opening located nearer the reference axis to an outer end of the slotted opening further from the reference axis than the inner end.

Further embodiments of the disclosure of are directed to a processing chamber. The processing chamber comprises a chamber body having sidewalls and a bottom bounding a process volume and a substrate support having a rotational axis within the process volume. The substrate support comprises a plurality of movable heaters positioned a distance from the rotational axis and arranged symmetrically around the rotational axis. The processing chamber comprises a chamber lid positioned in contact with a top edge of the sidewalls of the chamber body. The chamber lid comprises a lid body having a top surface and a bottom surface defining a thickness of the lid body, the lid body having a reference axis extending along a direction perpendicular to the lid body, a plurality of station openings extending through the thickness of the lid body and arranged symmetrically around the reference axis of the lid body, and a plurality of slotted openings extending through the thickness of the lid body, each of the slotted openings positioned between adjacent station openings and having a length and a width, the length measured from an inner end of the slotted opening located nearer the reference axis to an outer end of the slotted opening further from the reference axis than the inner end.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

DETAILED DESCRIPTION

Before describing several exemplary embodiments of the disclosure, it is to be understood that the disclosure is not limited to the details of construction or process steps set forth in the following description. The disclosure is capable of other embodiments and of being practiced or being carried out in various ways.

As used in this specification and the appended claims, the term "substrate" and "wafer" are used interchangeably, both referring to a surface, or portion of a surface, upon which a process acts. It will also be understood by those skilled in the art that reference to a substrate can also refer to only a portion of the substrate, unless the context clearly indicates otherwise. Additionally, reference to depositing on a substrate can mean both a bare substrate and a substrate with one or more films or features deposited or formed thereon.

A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, silicon nitride, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate (or otherwise generate or graft target chemical moieties to impart chemical functionality), anneal and/or bake the substrate surface. In addition to film processing directly on the surface of the substrate itself, in the present disclosure, any of the film processing steps disclosed may also be performed on an underlayer formed on the substrate as disclosed in more detail below, and the term "substrate surface" is intended to include such underlayer as the context indicates. Thus, for example, where a film/layer or partial film/layer has been deposited onto a substrate surface, the exposed surface of the newly deposited film/layer becomes the substrate surface. What a given substrate surface comprises will depend on what films are to be deposited, as well as the particular chemistry used.

"Atomic layer deposition" or "cyclical deposition" as used herein refers to the sequential exposure of two or more reactive compounds to deposit a layer of material on a substrate surface. The substrate, or portion of the substrate, is exposed sequentially or separately to the two or more reactive compounds which are introduced into a reaction zone of a processing chamber. In a time-domain ALD process, exposure to each reactive compound is separated by a time delay to allow each compound to adhere and/or react on the substrate surface and then be purged from the processing chamber. These reactive compounds are said to be exposed to the substrate sequentially.

In a spatial ALD process, different portions of the substrate surface, or material on the substrate surface, are exposed simultaneously to the two or more reactive compounds so that any given point on the substrate is substantially not exposed to more than one reactive compound simultaneously. As used in this specification and the appended claims, the term "substantially" used in this respect means, as will be understood by those skilled in the art, that there is the possibility that a small portion of the substrate may be exposed to multiple reactive gases simultaneously due to diffusion, and that the simultaneous exposure is unintended.

In one aspect of a time-domain ALD process, a first reactive gas (i.e., a first precursor or compound A, e.g., manganese precursor, ruthenium precursor, or a manganese-ruthenium precursor) is pulsed into the reaction zone followed by a first time delay. Next, a second precursor or compound B (e.g., reductant) is pulsed into the reaction zone followed by a second delay. During each time delay, a purge gas, such as argon, may be introduced into the processing chamber to purge the reaction zone or otherwise remove any residual reactive compound or reaction by-products from the reaction zone. Alternatively, the purge gas may flow continuously throughout the deposition process so that only the purge gas flows during the time delay between pulses of reactive compounds. The reactive compounds are alternatively pulsed until a desired film or film thickness is formed on the substrate surface. In either scenario, the ALD process of pulsing compound A, purge gas, compound B, and purge gas is a cycle. A cycle can start with either compound A or compound B and continue the respective order of the cycle until achieving a film with the predetermined thickness.

A "pulse" or "dose" as used herein is intended to refer to a quantity of a source gas that is intermittently or non-continuously introduced into the process chamber. The quantity of a particular compound within each pulse may vary over time, depending on the duration of the pulse. A particular process gas may include a single compound or a mixture/combination of two or more compounds, for example, the process gases described below.

The disclosure provides embodiments of a processing chamber. In one or more embodiments, the processing chamber comprises a chamber body having sidewalls and a bottom bounding a process volume. In one or more embodiments, the processing chamber comprises a substrate support having a rotational axis within the process volume. In one or more embodiments, the substrate support comprises a plurality of movable heaters positioned a distance from the rotational axis and arranged symmetrically around the rotational axis.

Figure 1:
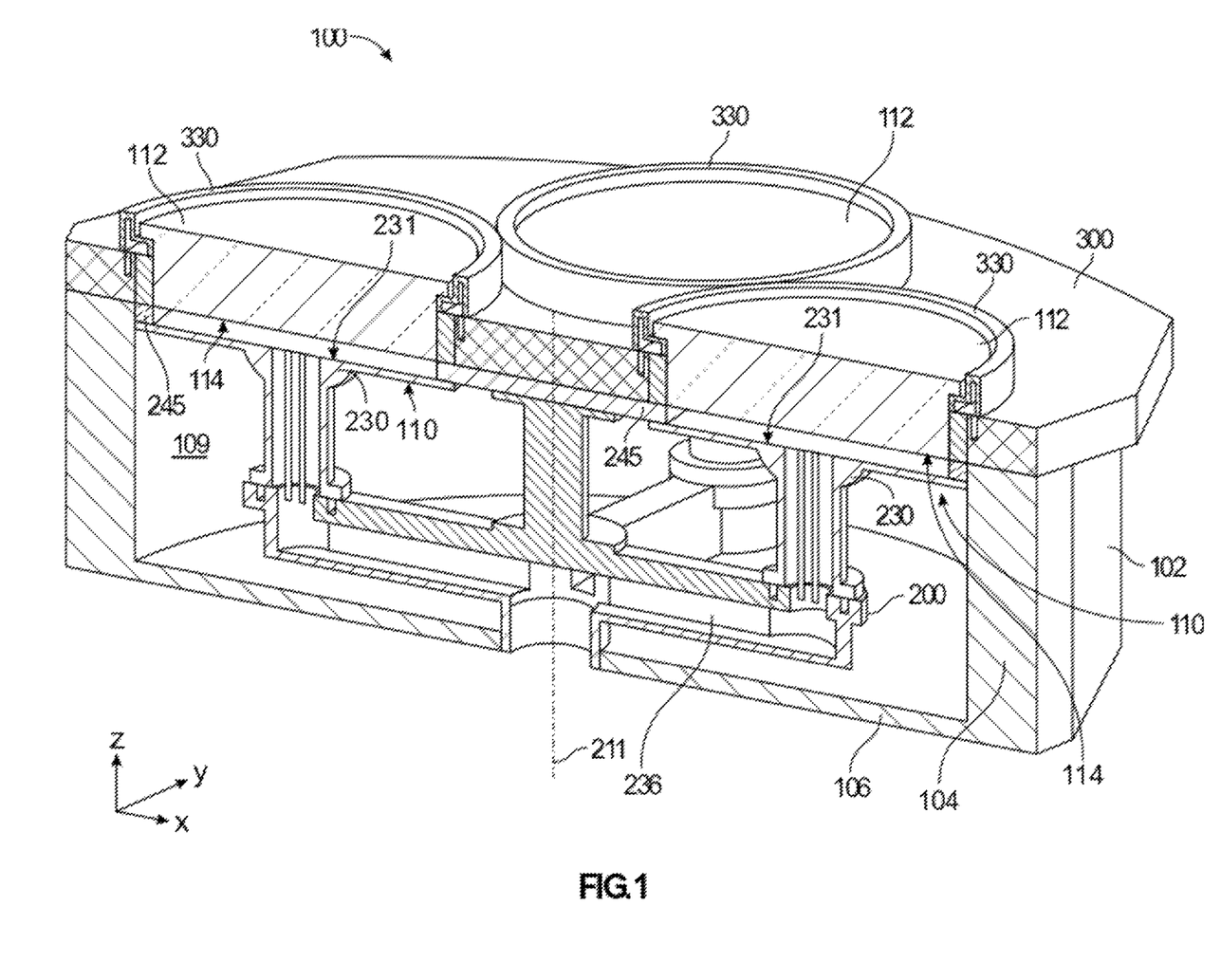
FIG. 1 shows a cross-sectional isometric view of a processing chamber in accordance with one or more embodiments of the disclosure.
Figure 2:
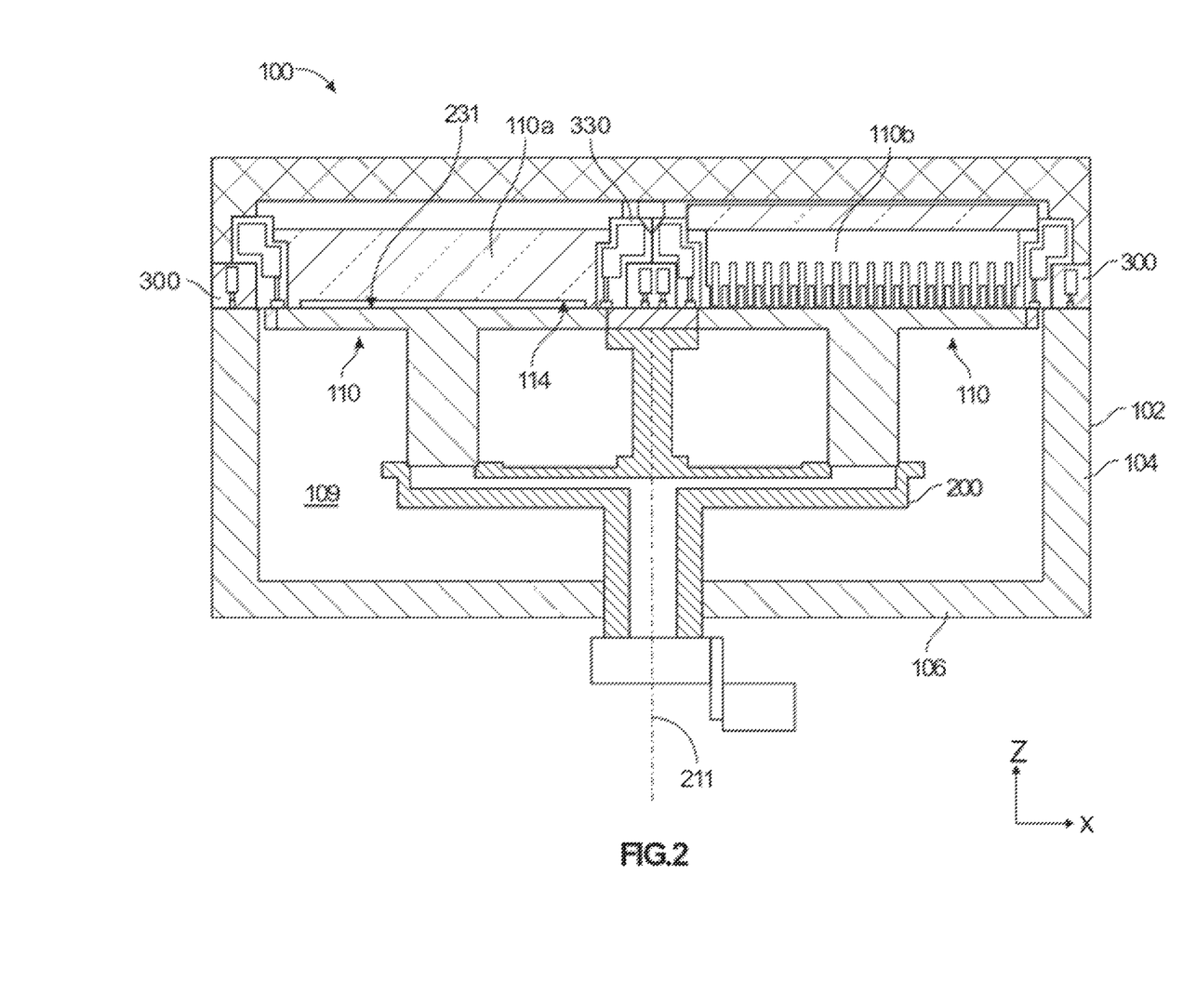
FIG. 2 shows a cross-sectional view of a processing chamber in accordance with one or more embodiments of the disclosure.

The disclosure provides methods for use with single wafer or multi-wafer (also referred to as batch) process chambers. FIGS. 1 and 2 illustrate a processing chamber 100 in accordance with one or more embodiment of the disclosure. FIG. 1 shows the processing chamber 100 illustrated as a cross-sectional isometric view in accordance with one or more embodiment of the disclosure. FIG. 2 shows a processing chamber 100 in cross-section according to one or more embodiment of the disclosure. Accordingly, some embodiments of the disclosure are directed to processing chambers 100 that incorporate a substrate support 200.

The processing chamber 100 has a housing 102 with walls 104 and a bottom 106. The housing 102 along with the processing chamber lid 300 define an interior volume 109, also referred to as an interior volume.

The processing chamber 100 illustrated includes a plurality of processing stations 110. The processing stations 110 are located in the interior volume 109 of the housing 102 and are positioned in a circular arrangement around the rotational axis 211 of the substrate support 200. Each processing station 110 comprises a gas distribution plate 112 (also referred to as a gas injector) having a front surface 114. In some embodiments, the front surfaces 114 of each of the gas distribution plates 112 are substantially coplanar. The processing stations 110 are defined as a region in which processing can occur. For example, in some embodiments, a processing station 110 is defined as a region bounded by the support surface 231 of the substrate support 200, as described below, and the front surface 114 of the gas distribution plates 112. In the illustrated embodiment, heaters 230 act as the substrate support surfaces and form part of the substrate support 200.

The processing stations 110 can be configured to perform any suitable process and provide any suitable process conditions. The type of gas distribution plate 112 used will depend on, for example, the type of process being performed and the type of showerhead or gas injector. For example, a processing station 110 configured to operate as an atomic layer deposition (ALD) apparatus may have a showerhead or vortex type gas injector, whereas a processing station 110 configured to operate as a plasma station may have one or more electrode and/or grounded plate configuration to generate a plasma while allowing a plasma gas to flow toward the wafer. The embodiment illustrated in FIG. 2 has a different type of processing station 110 on the left side (processing station 110a) of the drawing than on the right side (processing station 110b) of the drawing. Suitable processing stations 110 include, but are not limited to, thermal processing stations, microwave plasma, three-electrode CCP, ICP, parallel plate CCP, UV exposure, laser processing, pumping chambers, annealing stations and metrology stations.

Figure 3:
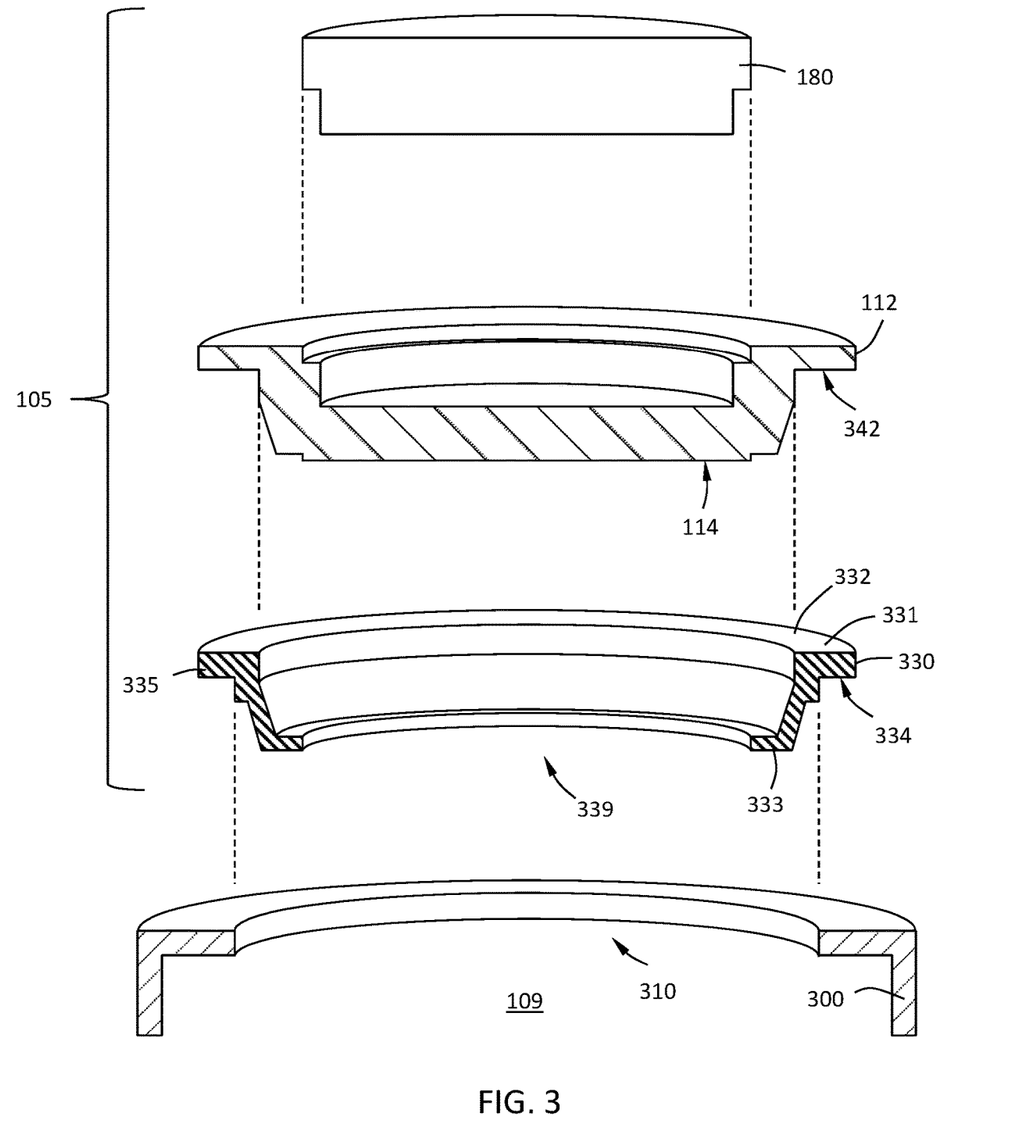
FIG. 3 is an exploded cross-sectional view of a processing station in accordance with one or more embodiments of the disclosure.

FIG. 3 illustrates an exploded view of a gas distribution assembly 105 for use in a processing station 110 or a process chamber in accordance with one or more embodiment of the disclosure. The skilled artisan will recognize that embodiment illustrated in FIG. 3 is a general schematic and omits details (e.g., gas channels). The gas distribution assembly 105 illustrated comprises three main components: a gas distribution plate 112, a lid 180 and an optional spacer 330. The spacer 330 is also referred to as a pump/purge spacer, insert or pump/purge insert. In some embodiments, the spacer 330 is connected to or in fluid communication with a vacuum (exhaust). In some embodiments, the spacer 330 is connected to or in fluid communication with a purge gas source.

The plurality of station openings 310 in the chamber lid 300 can be uniformly sized or have different sizes. Different sized/shape gas distribution plates 112 can be used with a pump/purge spacer 330 that is suitably shaped to transition from the plurality of station openings 310 to the gas distribution plate 112. For example, as illustrated, the pump/purge spacer 330 includes a top 331 and bottom 333 with a sidewall 335. When inserted into the plurality of openings 310 in the chamber lid 300, a ledge 334 is configured to be positioned in the plurality of openings 310.

The pump/purge spacer 330 includes an opening 339 in which a gas distribution plate 112 can be inserted. The gas distribution plate 112 illustrated has a flange 342 which can be in contact with the ledge formed by the back surface 332 adjacent the top 331 of the pump/purge spacer 330. The diameter or width of the gas distribution plate 112 can be any suitable size that can fit within the opening 339 of the pump/purge spacer 330. This allows gas distribution plates 112 of various types to be used within the same opening 310 in the chamber lid 300.

Figure 4:
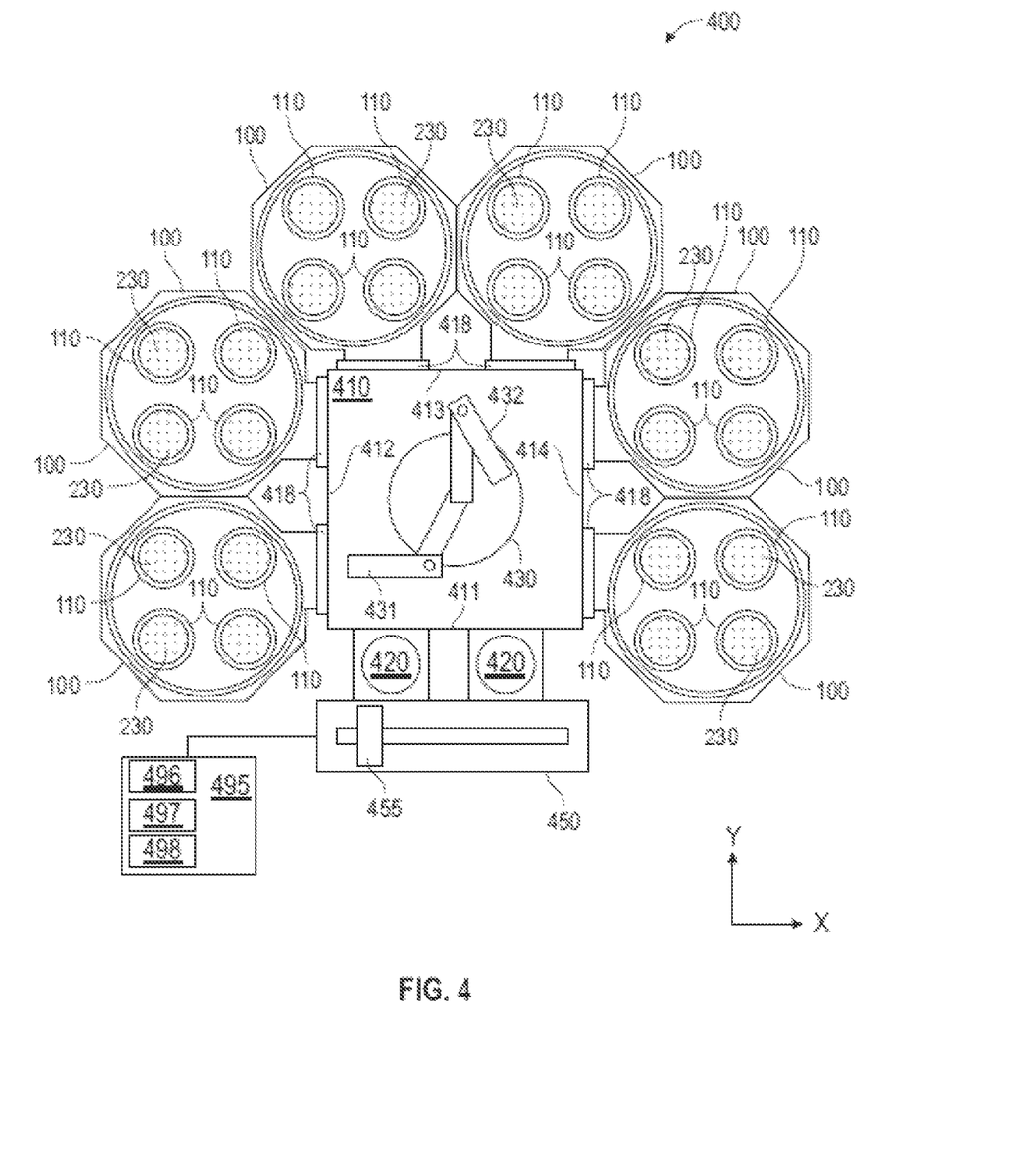
FIG. 4 is a schematic representation of a processing platform in accordance with one or more embodiments of the disclosure.

FIG. 4 shows a processing platform 400 in accordance with one or more embodiment of the disclosure. The embodiment shown in FIG. 4 is merely representative of one possible configuration and should not be taken as limiting the scope of the disclosure. For example, in some embodiments, the processing platform 400 has a different number of one or more of the processing chambers 100, buffer stations 420 and/or robot 430 configurations than the illustrated embodiment.

The exemplary processing platform 400 includes a central transfer station 410 which has a plurality of sides 411, 412, 413, 414. The transfer station 410 shown has a first side 411, a second side 412, a third side 413 and a fourth side 414. Although four sides are shown, those skilled in the art will understand that there can be any suitable number of sides to the transfer station 410 depending on, for example, the overall configuration of the processing platform 400. In some embodiments, there the transfer station 410 has three sides, four sides, five sides, six sides, seven sides or eight sides.

The transfer station 410 has a robot 430 positioned therein. The robot 430 can be any suitable robot capable of moving a wafer during processing. In some embodiments, the robot 430 has a first arm 431 and a second arm 432. The first arm 431 and second arm 432 can be moved independently of the other arm. The first arm 431 and second arm 432 can move in the x-y plane and/or along the z-axis. In some embodiments, the robot 430 includes a third arm (not shown) or a fourth arm (not shown). Each of the arms can move independently of other arms.

The embodiment illustrated includes six processing chambers 100 with two connected to each of the second side 412, third side 413 and fourth side 414 of the central transfer station 410. Each of the processing chambers 100 can be configured to perform different processes.

The processing platform 400 can also include one or more buffer station 420 connected to the first side 411 of the central transfer station 410. The buffer stations 420 can perform the same or different functions. For example, the buffer stations may hold a cassette of wafers which are processed and returned to the original cassette, or one of the buffer stations may hold unprocessed wafers which are moved to the other buffer station after processing. In some embodiments, one or more of the buffer stations are configured to pre-treat, pre-heat or clean the wafers before and/or after processing.

The processing platform 400 may also include one or more slit valves 418 between the central transfer station 410 and any of the processing chambers 100. The slit valves 418 can open and close to isolate the interior volume within the processing chamber 100 from the environment within the central transfer station 410. For example, if the processing chamber will generate plasma during processing, it may be helpful to close the slit valve for that processing chamber to prevent stray plasma from damaging the robot in the transfer station.

The processing platform 400 can be connected to a factory interface 450 to allow wafers or cassettes of wafers to be loaded into the processing platform 400. A robot 455 within the factory interface 450 can be used to move the wafers or cassettes into and out of the buffer stations. The wafers or cassettes can be moved within the processing platform 400 by the robot 430 in the central transfer station 410. In some embodiments, the factory interface 450 is a transfer station of another cluster tool (i.e., another multiple chamber processing platform).

A controller 495 may be provided and coupled to various components of the processing platform 400 to control the operation thereof. The controller 495 can be a single controller that controls the entire processing platform 400, or multiple controllers that control individual portions of the processing platform 400. For example, the processing platform 400 of some embodiments comprises separate controllers for one or more of the individual processing chambers 100, central transfer station 410, factory interface 450 and/or robots 430.

In some embodiments, the processing chamber 100 further comprises a controller 495 connected to the plurality of substantially coplanar support surfaces 231 configured to control one or more of the first temperature or the second temperature. In one or more embodiments, the controller 495 controls a movement speed of the substrate support 200 (FIG. 2).

In some embodiments, the controller 495 includes a central processing unit (CPU) 496, a memory 497, and support circuits 498. The controller 495 may control the processing platform 400 directly, or via computers (or controllers) associated with particular process chamber and/or support system components.

The controller 495 may be one of any form of general-purpose computer processor that can be used in an industrial setting for controlling various chambers and sub-processors. The memory 497 or computer readable medium of the controller 495 may be one or more of readily available memory such as random access memory (RAM), read only memory (ROM), floppy disk, hard disk, optical storage media (e.g., compact disc or digital video disc), flash drive, or any other form of digital storage, local or remote. The memory 497 can retain an instruction set that is operable by the processor (CPU 496) to control parameters and components of the processing platform 400.

The support circuits 498 are coupled to the CPU 496 for supporting the processor in a conventional manner. These circuits include cache, power supplies, clock circuits, input/output circuitry and subsystems, and the like. One or more processes may be stored in the memory 497 as software routine that, when executed or invoked by the processor, causes the processor to control the operation of the processing platform 400 or individual processing chambers in the manner described herein. The software routine may also be stored and/or executed by a second CPU (not shown) that is remotely located from the hardware being controlled by the CPU 496.

Some or all of the processes and methods of the present disclosure may also be performed in hardware. As such, the process may be implemented in software and executed using a computer system, in hardware as, e.g., an application specific integrated circuit or other type of hardware implementation, or as a combination of software and hardware. The software routine, when executed by the processor, transforms the general-purpose computer into a specific purpose computer (controller) that controls the chamber operation such that the processes are performed.

In some embodiments, the controller 495 has one or more configurations to execute individual processes or sub-processes to perform the method. The controller 495 can be connected to and configured to operate intermediate components to perform the functions of the methods. For example, the controller 495 can be connected to and configured to control one or more of gas valves, actuators, motors, slit valves, vacuum control or other components.

The durations for each pulse/dose are variable and may be adjusted to accommodate, for example, the volume capacity of the processing chamber as well as the capabilities of a vacuum system coupled thereto. Additionally, the dose time of a process gas may vary according to the flow rate of the process gas, the temperature of the process gas, the type of control valve, the type of process chamber employed, as well as the ability of the components of the process gas to adsorb onto the substrate surface. Dose times may also vary based upon the type of layer being formed and the geometry of the device being formed. A dose time should be long enough to provide a volume of compound sufficient to adsorb/chemisorb onto substantially the entire surface of the substrate and form a layer of a process gas component thereon.

Some embodiments of the disclosure are directed to film deposition processes using a batch processing chamber, also referred to as a spatial processing chamber. In one or more embodiments, the batch processing chamber may be any batch processing chamber known to one of skill in the art.

Figure 5:
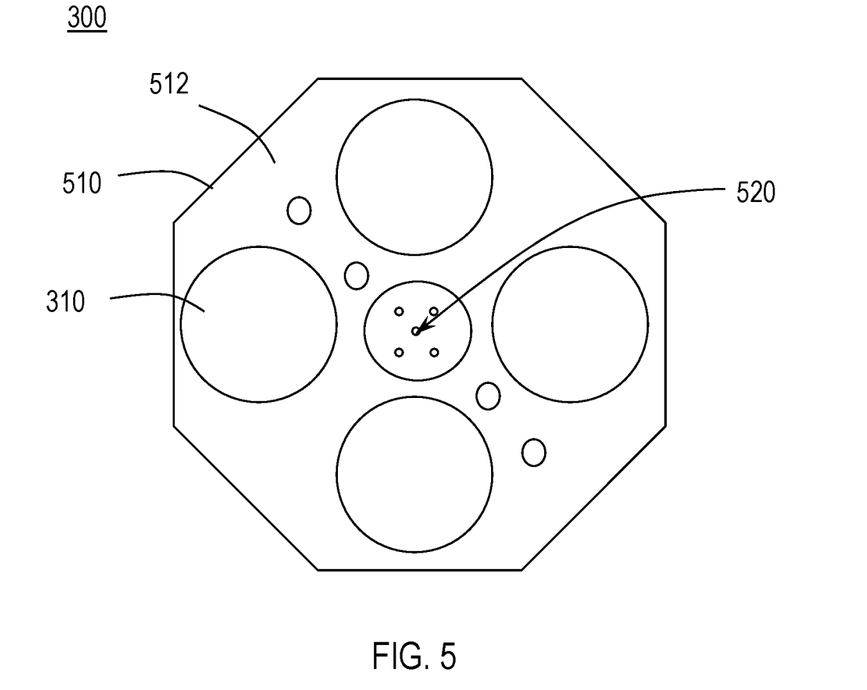
FIG. 5 shows a top view of a processing chamber lid in accordance with one or more embodiments of the disclosure
Figure 6:
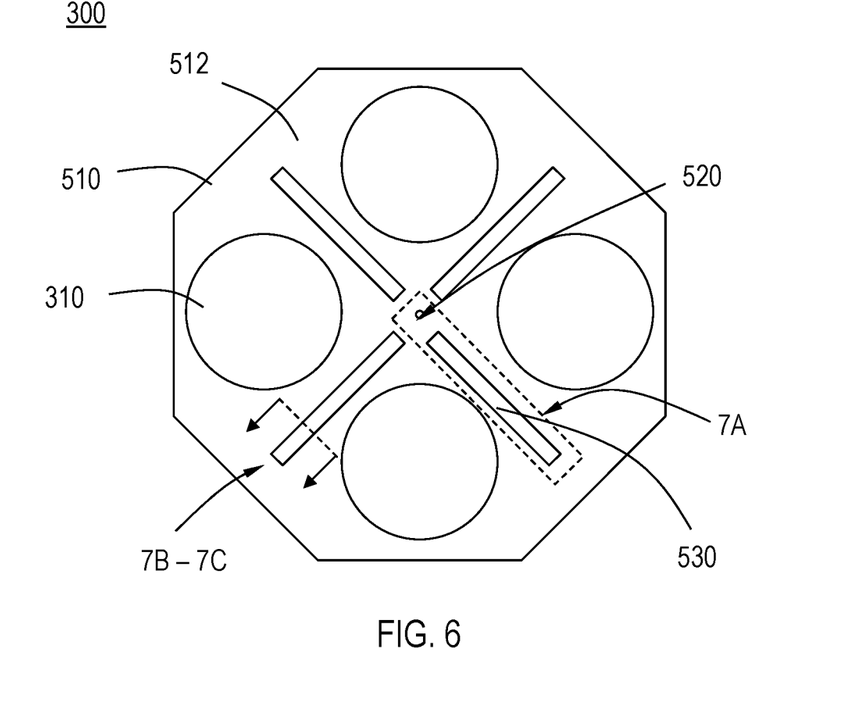
FIG. 6 shows a top view of a processing chamber lid in accordance with one or more embodiments of the disclosure.
Figure 7A:
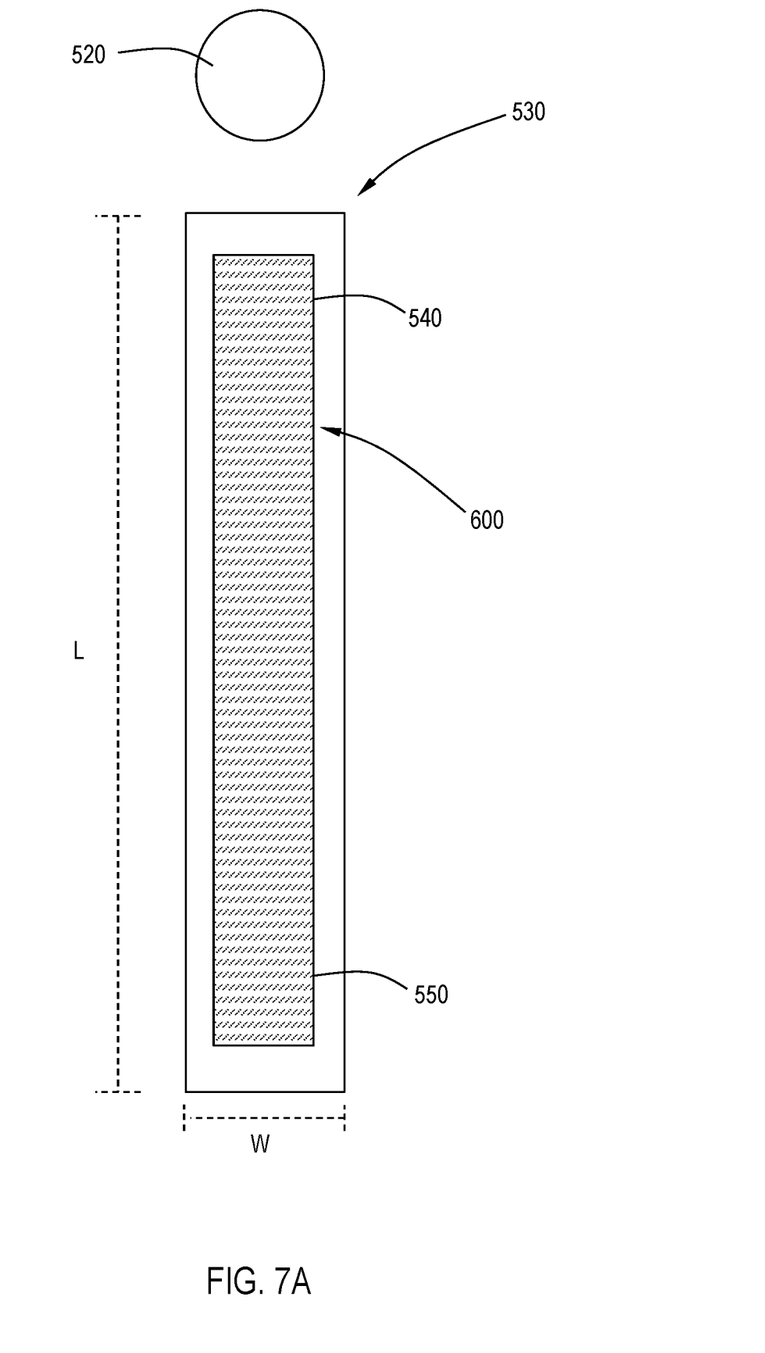
FIG. 7A shows a top view of a slot opening in accordance with one or more embodiments of the disclosure.
Figure 7B:
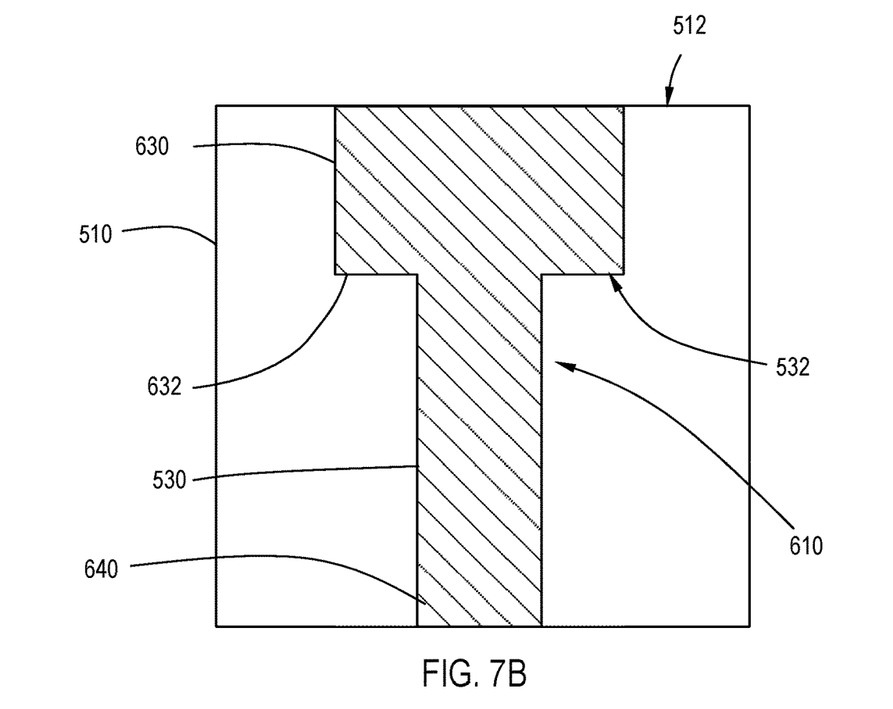
FIG. 7B shows a front sectional view of an embodiment of a metrology slot plate.
Figure 7C:
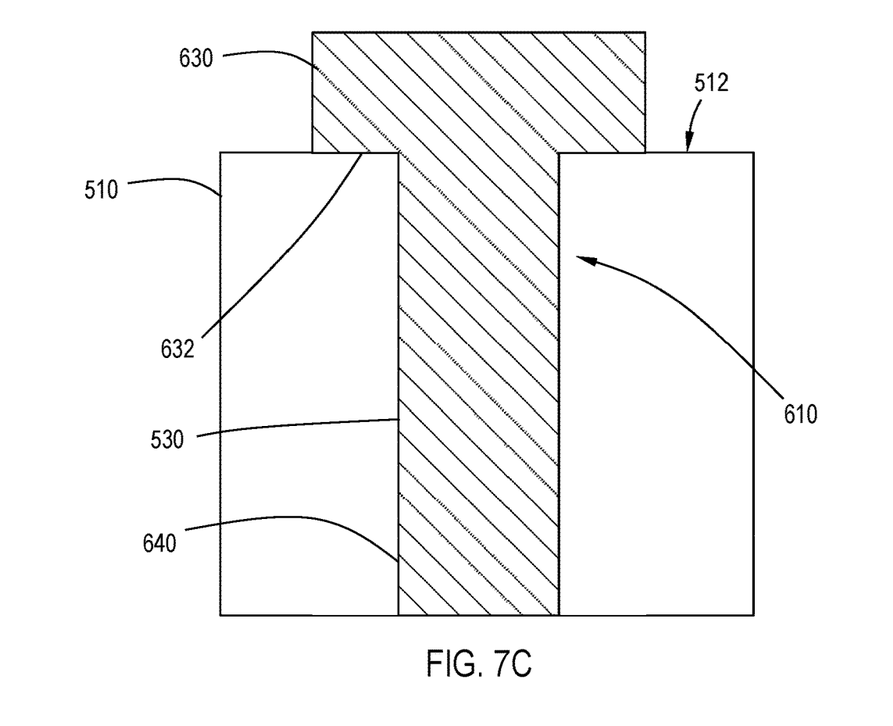
FIG. 7C shows a front sectional view of an embodiment of a metrology slot plate.

Referring to FIG. 5, the processing chamber lid 300 comprises a lid body 510 having a top surface 512 and a bottom surface defining a thickness of the lid body. In one or more embodiments, the thickness of the lid body is in a range of 1 inch to 5 inches, or in the range of 1.5 inches to 4.5 inches, or in the range of 2 inches to 4 inches. In one or more embodiments, the lid body 510 has a reference axis 520 extending along a direction perpendicular to the lid body 510. In one or more embodiments, the reference axis 520 is a central axis located in the center of the processing chamber lid and extending along a direction perpendicular to the lid body 510. The skilled artisan will recognize that embodiment illustrated in FIG. 5 shows the reference axis 520 as the central axis for illustrative purposes.

In one or more embodiments, the processing chamber lid 300 includes a plurality of station openings 310 extending through the thickness of the lid body and arranged symmetrically around the reference axis 520 of the lid body. In one or more embodiments, the plurality of station openings 310 includes at least two opening. In one or more embodiments, the plurality of station openings 310 comprises four openings.

Referring to FIGS. 5-7C, in one or more embodiments, the processing chamber lid 300 includes a plurality of slotted openings 530 extending through the thickness of the lid body. In one or more embodiments, each of the slotted openings 530 are positioned between adjacent station openings 310 and have a length L and a width W, the length measured from an inner end 540 of the slotted opening 530 located nearer the reference axis 520 to an outer end 550 of the slotted opening 530 further from the reference axis 520 than the inner end 540. In one or more embodiments, the processing chamber lid 300 comprises a metrology slot plate 600 positioned within each of the plurality of slotted openings 530. The length L of some embodiments is in the range of 100 mm to 400 mm, or in the range of 200 mm to 350 mm. FIG. 7A shows a top view of a slotted opening 530 having a metrology slot plate 600 positioned therein.

Embodiments of the disclosure advantageously provide vacuum sealed processing chambers. In one or more embodiments, the processing chamber lid 300 is vacuum sealed. In one or more embodiments, each of the metrology slot plates 600 in the plurality of slotted openings 530 has an independently vacuum sealed window.

Figure 8:
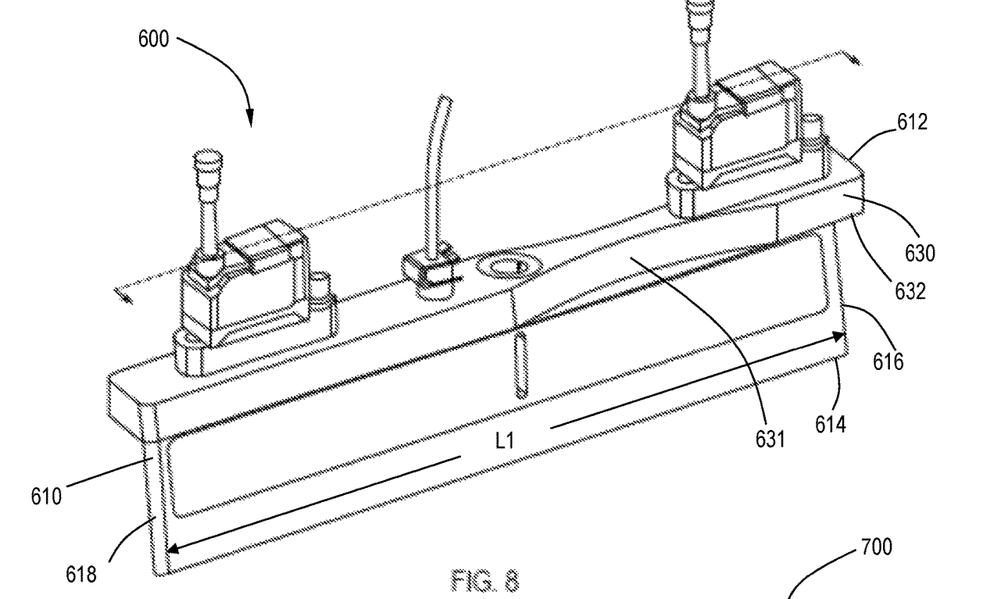
FIG. 8 shows a cross-sectional view of a laser and reflectometer metrology slot kit in accordance with one or more embodiments.
Figure 9:
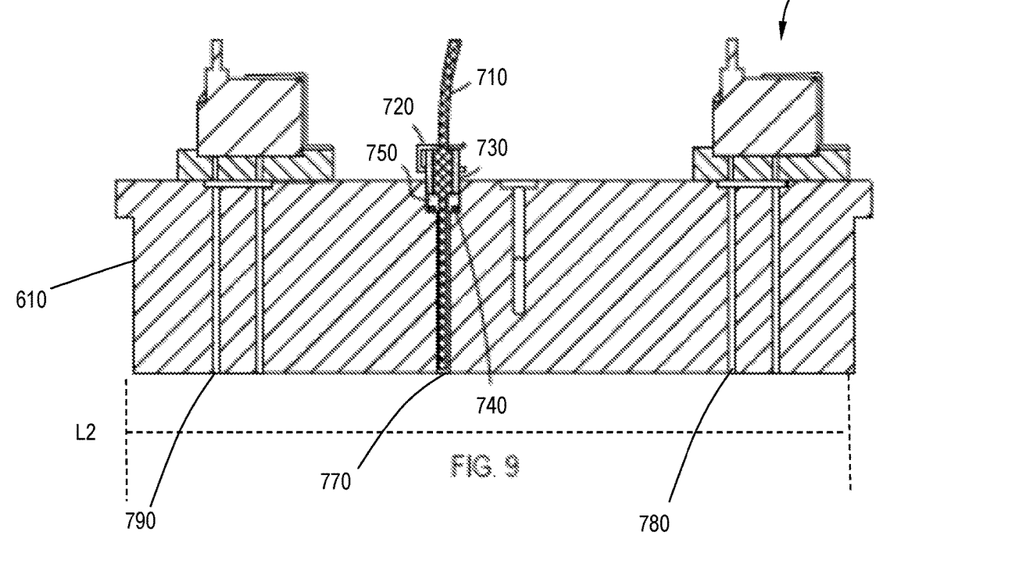
FIG. 9 shows a front view of the laser and reflectometer metrology slot kit of FIG. 8.

Referring to FIGS. 8 and 9, the metrology slot plate 600 comprises an elongate metrology plate body 610 having a top surface 612 and a bottom surface 614 defining a thickness of the elongate metrology plate body 610. In one or more embodiments, the thickness of the elongate metrology plate body 610 is in a range of 2 inches to 6 inches, or in the range of 2.5 inches to 5 inches.

In one or more embodiments, the elongate metrology plate body 610 has an inner end 616 and an outer end 618 defining a length L1 of the body. In some embodiments, one or more of the inner end 616 and outer end 618 comprises a gas port (not shown) configured to provide one or more of a vacuum stream or purge gas stream along an end face of the lower portion. In one or more embodiments, the length L1 of the body is in a range of 100 mm to 400 mm, or in the range of 250 mm to 375 mm, or in the range of 300 mm to 350 mm.

Referring back to FIGS. 7B and 7C, the elongate metrology plate body 610 has an upper portion 630 and a lower portion 640. In one or more embodiments, the upper portion 630 has a greater width than the lower portion 640 to form a bottom face 632 of the upper portion. In one or more embodiments, the bottom face 632 of the upper portion 630 is configured to support the elongate metrology slot plate 600 within the slotted opening 530 on a ledge 532 (see FIG. 7B). In some embodiments, the bottom face 632 of the upper portion 630 is configured to support the elongate metrology slot plate 600 on the top surface 512 of the lid body 510 (see FIG. 7C). In one or more embodiments, the upper portion 630 of the elongate metrology plate body 610 has a width in a range of from 10 mm to 50 mm, or in the range of 15 mm to 45 mm, or in the range of 20 mm to 40 mm, or in the range of 25 mm to 35 mm.

Referring to FIG. 8, the upper portion 630 of the elongate metrology slot plate 600 comprises an arcuate recess 631 formed in a side face of the upper portion 630. In one or more embodiments, the lower portion 640 of the elongate metrology plate body 610 has a width in a range of from 5 mm to 15 mm, or in the range of 7.5 mm to 10 mm. Referring to FIG. 9, the lower portion 640 of the elongate metrology plate body 610 has a first side face and a second side face extending along a length L2 of the lower portion. In one or more embodiments, the length L2 of the lower portion in a range of 300 mm to 400 mm, or in the range of 325 mm to 375 mm, or in the range of 350 mm to 360 mm.

In one or more embodiments, the metrology slot plate 600 comprises an inlet (not shown) in the top surface 612 of the elongate metrology plate body 610. In one or more embodiments, the inlet is connected to a gas channel extending at least partially through the thickness of the body 610 to an outlet.

In one or more embodiments, the metrology slot plate 600 comprises a pyrometer opening (not shown) extending through the thickness of the body 610. In one or more embodiments, a pyrometer is placed in the pyrometer opening.

In one or more embodiments, the metrology slot plate 600 comprises recesses 631 formed in the first side face and the second side face of the lower portion. In one or more embodiments, the recesses 631 are in fluid communication with the gas channel to allow a flow of gas to pass from the inlet through the gas channel and in the recesses.

In one or more embodiments, each of the elongate metrology slot plates 600 independently comprises one or more of a plate blank, a reflectometer, a capacitance sensor, a gas flow meter, a manometer, a pyrometer, a distance sensor or an emissometer.

In one or more embodiments, at least one of the elongate metrology slot plates 600 comprises one or more of a plate blank, a reflectometer, a capacitance sensor, a gas flow meter, a manometer, a pyrometer, a distance sensor or an emissometer configured to measure a temperature of a wafer during processing. In one or more embodiments, at least one of the elongate metrology slot plates 600 comprises one or more of a plate blank, a reflectometer, a capacitance sensor, a gas flow meter, a manometer, a pyrometer, a distance sensor or an emissometer configured to measure a temperature of a wafer as the wafer moves from one processing station to another processing station. In one or more embodiments, at least one of the elongate metrology slot plates 600 comprises a pyrometer configured to measure a temperature of a wafer during processing. In one or more embodiments, at least one of the elongate metrology plates comprises a pyrometer configured to measure a temperature of a wafer as the wafer moves from one processing station to another processing station. In some embodiments, the metrology slot plate is outside the "process zone", being located between process stations. In some embodiments, the metrology slot plate is configured to measure the temperature of the wafer as it moves between process stations, providing a repeatable (no drift) metrology solution.

In one or more embodiments, the plate blank may be placed in the elongate metrology plate. The plate blank occupies the slotted opening 530 in the process chamber lid 300 when there is no elongate metrology slot plate 600 used. The plate blank provides a gas-tight seal to the process chamber lid 300 to maintain operating pressures within the processing chamber.

In one or more embodiments, the elongate metrology slot plate 600 comprises a reflectometer. In some embodiments, the reflectometer is configured to measure the temperature of a wafer or substrate support surface. In some embodiments, the reflectometer is a portion of a feedback loop including heater control to provide for corrections or adjustment to the wafer temperature. In one or more embodiments, the reflectometer is used to detect and measure reflected pulses of energy from a wafer. The reflectometer of some embodiments allows for measuring the thickness of a film being formed on a wafer. The reflectometer transmits light to the surface and measures light reflected back from the surface. In some embodiments, the reflectometer is configured to measure one or more of temperature or a relative change in the surface emissivity which can be correlated to film thickness.

In one or more embodiments, the elongate metrology slot plate 600 comprises a capacitance sensor. In some embodiments, the capacitance sensor is configured to measure capacitance of a wafer or film on a wafer. In some embodiments, the capacitance sensor is configured to measure the gap distance and/or film thickness variations.

In one or more embodiments, the elongate metrology slot plate 600 comprises a gas flow meter. In some embodiments, the gas flow meter is configured to control a flow of gas into the elongate metrology slot plate 600 to provide a gas curtain around one or more sensors within the elongate metrology slot plate 600.

In one or more embodiments, each of the elongate metrology slot plates 600 independently comprises a gas pressure sensor configured to monitor the pressure of the gas in a gas delivery system. Any suitable gas pressure sensor such as a manometer or a pressure transducer suitable for use in a chemical vapor deposition or atomic layer deposition system may be used. In one or more embodiments, each of the elongate metrology slot plates 600 independently comprises a manometer.

In one or more embodiments, the elongate metrology slot plate 600 comprises a distance sensor. In some embodiments, the distance sensor comprises a laser height sensor. In one or more embodiments, the laser height sensor is configured to emit a light beam down through a wide slot in the metrology slot plate and collect the light reflected off of the wafer or heater surface, at an angle, to precisely measure a distance to a surface where the beam reflects. In one or more embodiments, the laser height sensor monitors distance between the process chamber lid 300 and the wafer, runout of heaters 230, electrostatic chuck coplanarity and/or adjacent spinner plates.

In one or more embodiments the elongate metrology slot plate 600 comprises an emissometer. In some embodiments, the emissometer is configured to measure one or more property of a film on a wafer passing below the elongate metrology slot plate 600. In some embodiments, the emissometer is configured to measure reflected energy from the surface.

Embodiments of the disclosure advantageously provide sensor probes in elongate metrology slot plates 600 that can be moved from one processing chamber 100 or processing station 110 to another processing chamber 100 or processing station 110 without breaking vacuum.

Referring to FIGS. 8 and 9, in one or more embodiments, the elongate metrology slot plate 600 comprises a laser height sensor and a reflectometer. In one or more embodiments, an elongate metrology slot plate 600 comprising the laser height sensor and the reflectometer is referred to as a laser and reflectometer lid slot kit 700. In one or more embodiments, the laser and reflectometer lid slot kit 700 comprises a reflectometer probe 710 positioned at a wafer center 770, a spring clip 720, a peek nut 730, an o-ring 740, and a peek spacer 750.

In one or more embodiments, the laser and reflectometer lid slot kit 700 has an inner laser focal point 780 and an outer laser focal point 790. In one or more embodiments, the inner laser focal point 780 is positioned at a distance in a range of from 140 nm to 150 nm from the wafer center 770. In one or more embodiments, the outer laser focal point 790 is positioned at a distance in a range of from 110 nm to 120 nm from the wafer center 770.

Figure 10:
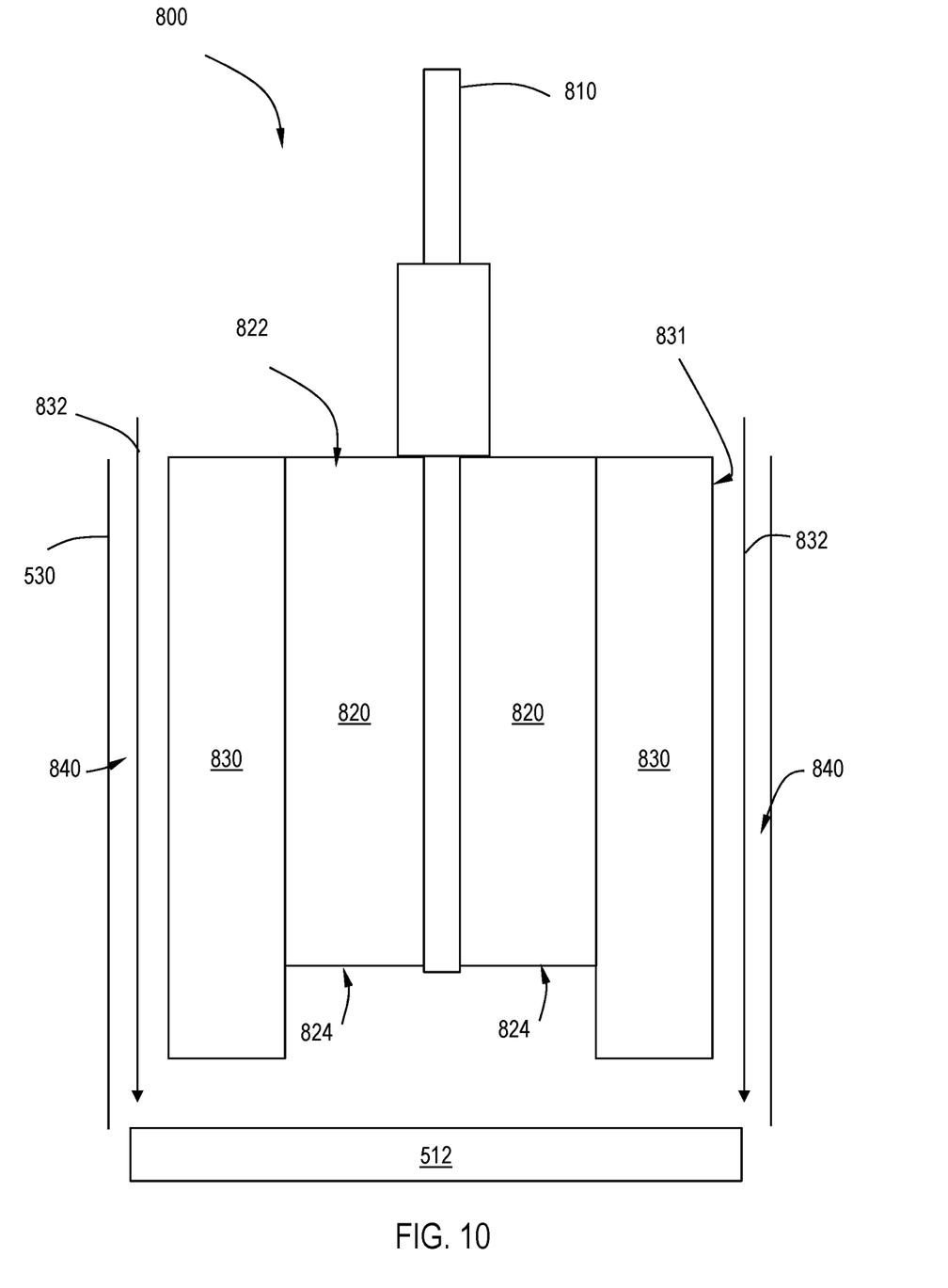
FIG. 10 shows a cross-sectional view of a pyrometer in accordance with one or more embodiments.

Referring to FIG. 10, a cross-sectional view of a light pipe 800 is shown. As the skilled artisan will be aware, a pyrometer is a remote sensing device attached to light pipes via a flexible light transmitting cable. The light pipe 800 of some embodiments comprises a semi-rigid sapphire probe protected by a metal sheath and mounted into a metal body with a cable connection interface. In one or more embodiments, an elongate metrology slot plate comprises the light pipe 800. In one or more embodiments, an elongate metrology slot plate having a light pipe 800 is positioned in one or more slotted openings 530. In one or more embodiments, the light pipe 800 comprises a light pipe assembly 810. In one or more embodiments, the light pipe assembly 810 is surrounded by a light pipe shield 820. In one or more embodiments, the light pipe shield 820 has a top end 822 and a bottom end 824, the bottom end 824 closer to a wafer than the top end 822. In one or more embodiments, a quartz window 830 surrounds the light pipe assembly 810 and the light pipe shield 820. In one or more embodiments, the quartz window 830 has a height extending from the top end of the light pipe shield to a range of 1 mm to 3 mm above a wafer or substrate support surface. In one or more embodiments, the height of the quartz window extends in a range of 2.5 mm to 4.5 mm further than the bottom end of the pyrometer shield.

The quartz window 830 has an outer surface 831. In one or more embodiments, the light pipe 800 comprises a purge slot 840 defined between the outer surface 831 of the quartz window 830 and the slotted opening 530.

In some embodiments, the light pipe 800 does not enter into the vacuum process zone. A quartz window is incorporated to form a vacuum barrier. The light pipes are inserted into the window (a long tube with a top sealing flange and 1 mm thick cover window) that light passes through near the wafer. In some embodiments, the quartz window is purged with an inert gas.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

Although the disclosure herein has been described with reference to particular embodiments, it is to be understood that these embodiments are merely illustrative of the principles and applications of the present disclosure. It will be apparent to those skilled in the art that various modifications and variations can be made to the method and apparatus of the present disclosure without departing from the spirit and scope of the disclosure. Thus, it is intended that the present disclosure include modifications and variations that are within the scope of the appended claims and their equivalents.

What is claimed is:

1. A metrology slot plate comprising:
an elongate metrology plate body having a top surface and a bottom surface defining a thickness of the elongate metrology plate body, an inner end and an outer end defining a length of the elongate metrology plate body;
the elongate metrology plate body having an upper portion and a lower portion, the upper portion having a greater width than the lower portion to form a bottom face of the upper portion, the lower portion having a first side face and a second side face extending along a length of the lower portion;
an inlet in the top surface of the elongate metrology plate body, the inlet connected to a gas channel extending at least partially through the thickness of the elongate metrology plate body to an outlet;
recesses formed in the first side face and the second side face of the lower portion of the elongate metrology plate body, the recesses in fluid communication with the gas channel to allow a flow of gas to pass from the inlet through the gas channel and in the recesses; and
a pyrometer opening extending through the thickness of the elongate metrology plate body.

2. The metrology slot plate of claim 1, wherein one or more of the inner end of the elongate metrology plate body and the outer end of the metrology plate body comprises a gas port configured to provide one or more of a vacuum stream or purge gas stream along an end face of the lower portion of the elongate metrology plate body.

3. The metrology slot plate of claim 1, wherein the upper portion of the elongate metrology plate body comprises an arcuate recess formed in a side face of the upper portion.

* * * * *